(12) United States Patent
Lavangkul et al.

(10) Patent No.: US 12,170,256 B2
(45) Date of Patent: Dec. 17, 2024

(54) CONTACT PAD FABRICATION PROCESS FOR A SEMICONDUCTOR PRODUCT

(71) Applicant: Texas Instruments Incorporated, Dallas, TX (US)

(72) Inventors: Sudtida Lavangkul, Murphy, TX (US); Yung Shan Chang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 502 days.

(21) Appl. No.: 17/459,849

(22) Filed: Aug. 27, 2021

(65) Prior Publication Data
US 2023/0061951 A1  Mar. 2, 2023

(51) Int. Cl.
| | |
|---|---|
| H01L 23/48 | (2006.01) |
| H01L 21/311 | (2006.01) |
| H01L 21/44 | (2006.01) |
| H01L 23/00 | (2006.01) |
| H01L 23/532 | (2006.01) |

(52) U.S. Cl.
CPC ........ *H01L 24/05* (2013.01); *H01L 21/31144* (2013.01); *H01L 23/53295* (2013.01); *H01L 24/03* (2013.01); H01L 2224/03466 (2013.01); H01L 2224/03845 (2013.01); H01L 2224/05147 (2013.01); H01L 2224/05554 (2013.01); H01L 2224/05556 (2013.01); H01L 2224/05562 (2013.01); H01L 2224/05571 (2013.01); H01L 2224/05583 (2013.01); H01L 2224/05655 (2013.01); H01L 2224/05664 (2013.01); H01L 2224/05681 (2013.01); H01L 2224/05684 (2013.01)

(58) Field of Classification Search
CPC . H01L 2224/05583; H01L 2224/05655; H01L 2224/05571; H01L 2224/05562; H01L 2224/05556; H01L 2224/05554; H01L 2224/05147; H01L 2224/03845; H01L 2224/03466; H01L 23/53295; H01L 21/31144; H01L 14/03; H01L 24/05
See application file for complete search history.

(56) References Cited

U.S. PATENT DOCUMENTS

| | | | |
|---|---|---|---|
| 9,716,013 B2 | 7/2017 | Stewart et al. | |
| 10,811,492 B2 | 10/2020 | West et al. | |
| 11,605,576 B2 * | 3/2023 | Woolsey | H01L 24/02 |
| 2004/0238964 A1 * | 12/2004 | Kawano | H01L 21/76804 257/E21.585 |
| 2007/0020906 A1 * | 1/2007 | Chiu | H01L 24/05 438/597 |

(Continued)

*Primary Examiner* — Hoa B Trinh
(74) *Attorney, Agent, or Firm* — Andrew R. Ralston; Frank D. Cimino

(57) ABSTRACT

A method for fabricating a semiconductor product includes forming a dielectric layer over a top level metallization layer of a semiconductor process wafer. The dielectric layer is patterned using a grayscale mask process to define a contact pad opening in the dielectric layer, thereby producing a patterned dielectric layer in which the contact pad opening is aligned to a contact pad defined in the top level metallization layer. A metal layer is deposited over the patterned dielectric layer, including within the contact pad opening. A portion of the metal layer is removed by a chemical mechanical polishing (CMP) process, with a remaining portion of the metal layer having a sloped sidewall.

25 Claims, 8 Drawing Sheets

(56) References Cited

U.S. PATENT DOCUMENTS

2010/0090344 A1\* 4/2010 Ota ................... H01L 24/05
257/773
2014/0353820 A1\* 12/2014 Yu ..................... H01L 24/13
257/737
2016/0133690 A1 5/2016 West et al.

\* cited by examiner

CONTACT PAD FABRICATION PROCESS FOR A SEMICONDUCTOR PRODUCT

FIELD OF THE DISCLOSURE

Disclosed implementations relate generally to the field of semiconductor fabrication, and more particularly, but not exclusively, to a contact pad fabrication process and a process wafer or semiconductor product having a plurality of contact pads fabricated using the same.

BACKGROUND

Without limitation, the following is provided in the context of bond pad integration of a semiconductor process flow. Fabricating defect-free bond pads (also referred to as contact pads) is important because it is desirable to have reliable performance when a semiconductor device or product is deployed in the field and/or under test (e.g., in-line probing). Metal layers used in bond pad integration are often polished using chemical-mechanical techniques.

SUMMARY

In one aspect, an implementation of a semiconductor fabrication method is disclosed. The method comprises, inter alia, forming a dielectric layer over a top level metallization layer of a semiconductor process wafer; patterning the dielectric layer using a grayscale mask process to define a contact pad opening in the dielectric layer, thereby producing a patterned dielectric layer, wherein the contact pad opening is aligned to a contact pad defined in the top level metallization layer; depositing a metal layer over the patterned dielectric layer including within the contact pad opening; and removing a portion of the metal layer by a chemical mechanical polishing (CMP) process, a remaining portion of the metal layer having a sloped sidewall. In one arrangement, the patterning of the dielectric layer may comprise, prior to depositing one or more metal layers, exposing the photoresist layer in the grayscale mask process using a photomask having a dithered region surrounding a mask area that defined the contact pad opening; and etching the dielectric layer, thereby generating a sloped sidewall profile for the contact pad opening in the dielectric layer. In one arrangement, the photoresist layer comprises is a positive photoresist and the surrounded mask area is fully opaque.

In another aspect, a semiconductor product is disclosed, which comprises, inter alia, a semiconductor substrate including a top level metallization layer; and a plurality of contact pad structures formed in a dielectric layer deposited over the top level metallization layer, the plurality of contact pad structures each having a sloped sidewall profile. In one arrangement, the sloped sidewall profile may be formed in a grayscale mask process before one or more metal layers are deposited and polished. In one arrangement, the plurality of contact pad structures may be configured to facilitate electrical connectivity between the top level metallization layer and an external system (e.g., a wire bond frame, a test probe system, etc.). In one arrangement, the plurality of contact pad structures may be formed by patterning the dielectric layer using a photoresist exposed with a photomask having a dithered region surrounding a mask area that defines a contact pad opening in the dielectric layer corresponding to a respective one of a plurality of contact pads defined in the top level metallization layer, the dithered region varying in density from the surrounded mask area to a mask field area surrounding the dithered region. In one arrangement, each contact pad structure may comprise a bottom surface having a substantially square shape, wherein the sloped sidewall profile of the contact pad structure may be provided with first and second sidewall vertical angular deviations along a first horizontal axis, and third and fourth sidewall vertical angular deviations along a second horizontal axis perpendicular to the first horizontal axis. In a further arrangement, the first, second, third and fourth sidewall vertical angular deviations of a sloped sidewall profile may depend on the sizing of the dithered region surrounding the corresponding mask area along the first and second horizontal axes in the photomask. In a further arrangement, the dithered region surrounding a mask area may contain an array of sub-resolution features, referred to as gratings, that may gradually vary in at least one of grating feature size, density/distribution, grating feature shape, and/or the number of grating features, or any combination thereof, between the mask area (e.g., a fully transparent area) and the mask field area (e.g., a fully opaque area) of the photomask, any of which may be optimized or optimally configured depending on a desired sidewall profile according to an example implementation.

In a still further aspect, a method is disclosed, which comprises, inter alia, forming a dielectric layer over a metal contact pad located over a semiconductor substrate; forming a photoresist layer over the dielectric layer; forming an opening in the photoresist layer over the metal contact pad thereby exposing a portion of the dielectric layer; and etching the dielectric layer thereby removing the exposed portion of the dielectric and forming dielectric sidewalls surrounding the metal contact pad that have a vertical angular deviation of at least 20°. In one variation, the vertical angular deviation is in a range from 20° to 35°. In another variation, the vertical angular deviation is in a range from 35° to 45°. In another variation, the vertical angular deviation is in a range from 45° to 55°.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

DETAILED DESCRIPTION OF THE DRAWINGS

Figure 1:
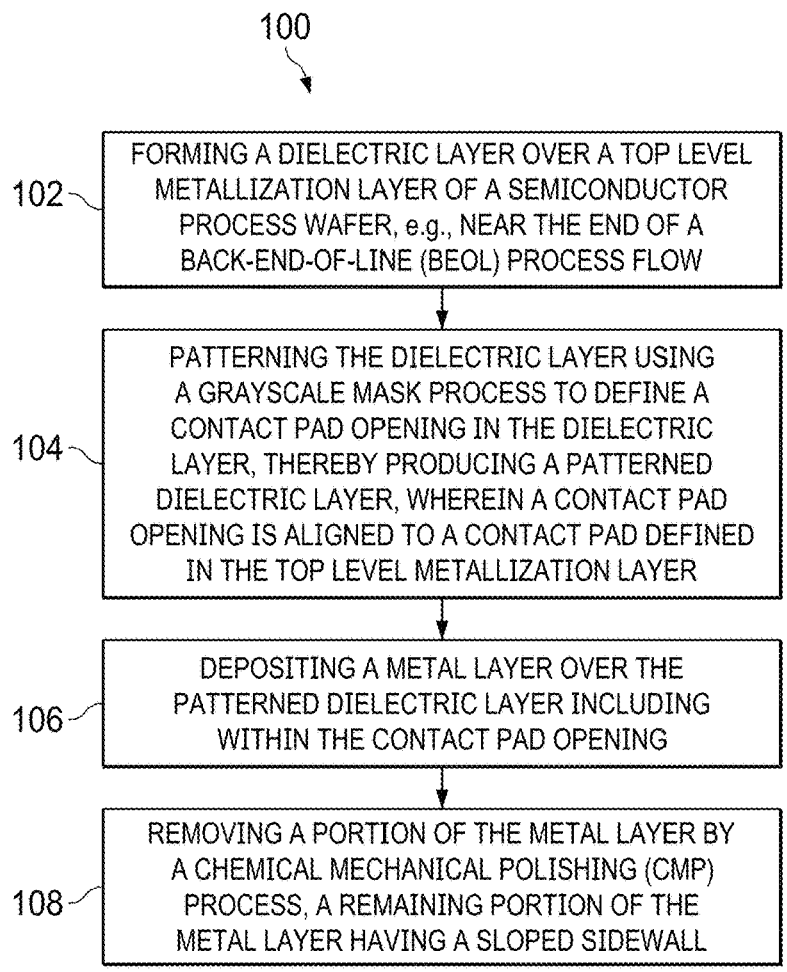
FIG. 1 depicts an example method of fabricating a semiconductor product including a plurality of contact pads with sloped sidewall profiles according to an implementation of the disclosure.

Example embodiments of the disclosure are described with reference to the attached Figures wherein like reference numerals are generally utilized to refer to like elements. The Figures are not drawn to scale and they are provided merely to illustrate example embodiments. Numerous specific details, relationships, and methods are set forth below to provide an understanding of one or more example embodiments. However, it should be understood that some embodiments may be practiced without such specific details. In other instances, well-known circuits, subsystems, components, structures and techniques have not been shown in detail in order not to obscure the understanding of the example embodiments. Accordingly, it will be appreciated by one skilled in the art that the embodiments of the present disclosure may be practiced without such specific components.

In the following description, reference may be made to the accompanying drawings wherein certain directional terminology, such as, e.g., "upper", "lower", "top", "bottom", "left-hand", "right-hand", "front side", "backside", "vertical", "horizontal", etc., may be used with reference to the orientation of the Figures or illustrative elements thereof being described. Because components of some embodiments can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. Further, the features of example embodiments described herein may be combined with each other unless specifically noted otherwise.

As used herein, the term "couple" or "couples" is intended to mean either an indirect or direct conductive connection unless qualified as in "communicably coupled" which may include wireless connections. Thus, if a first device couples to a second device, that connection may be through a direct conductive connection, or through an indirect conductive connection via other devices and connections.

Various disclosed methods and devices of the present disclosure may be beneficially applied to processing integrated circuits, e.g., when forming metal contact pad structures at a top metal level. While such embodiments may be expected to reduce defectivity that may result from forming such structures, no particular result is a requirement of the present invention unless explicitly recited in a particular claim.

Using chemical mechanical polishing technique to remove metal from bond pads provides cost advantage over some alternative processes. However, polishing incompletely filled structures may negatively impact the structural integrity of the bond pad metallization. In some implementations bond or contact pads can vary widely in size. Smaller pads may be completely metal-filled, while larger ones may have metal that is more conformal with an opening in a passivation dielectric layer. These pads with greater topography may experience stresses during CMP that may not be present for filled pads, and such stresses may result in defect modes particular to the partially filled pads.

Figure 6A:
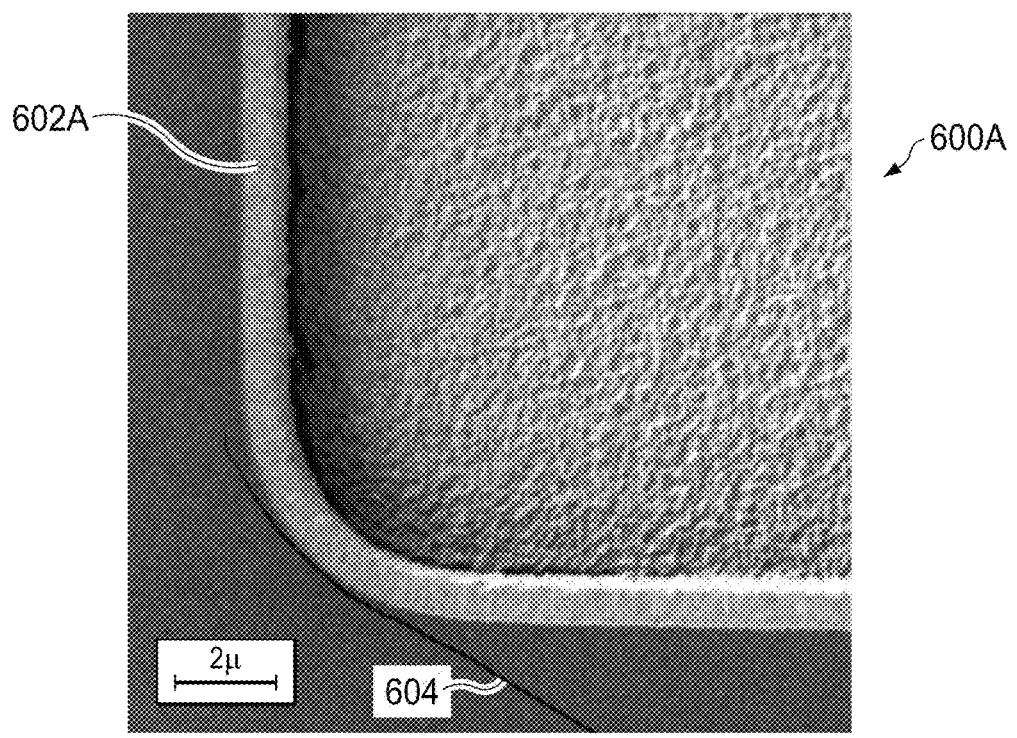
FIGS. 6A-6C depict scanning electron microscopy (SEM) images of baseline contact pad structures exhibiting one or more types of defects which may be prevented in an example implementation of the disclosure.
Figure 6B:
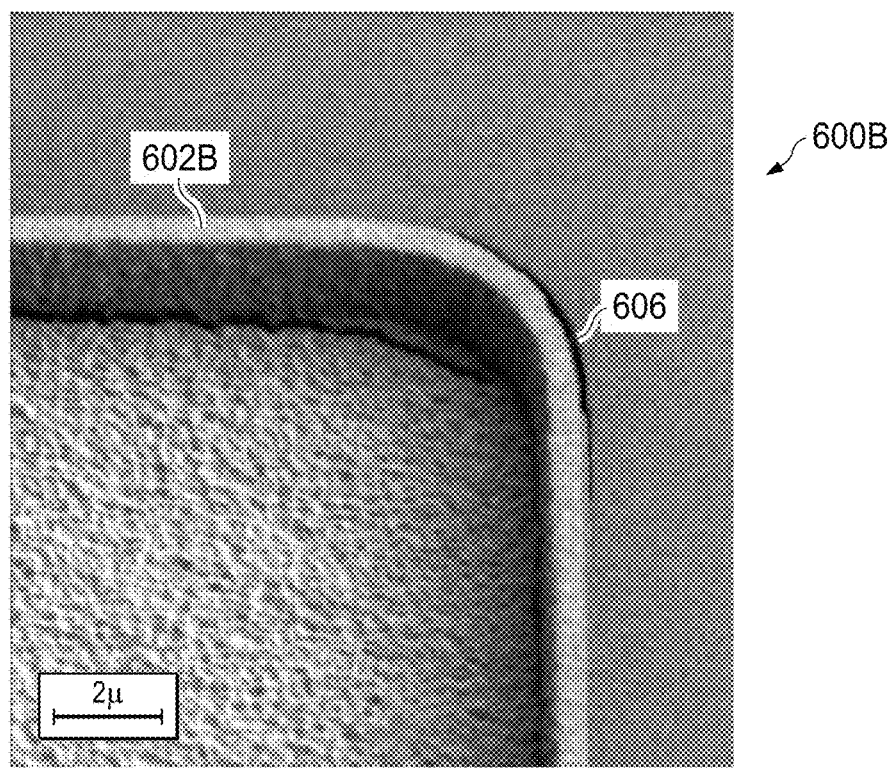
Figure 6C:
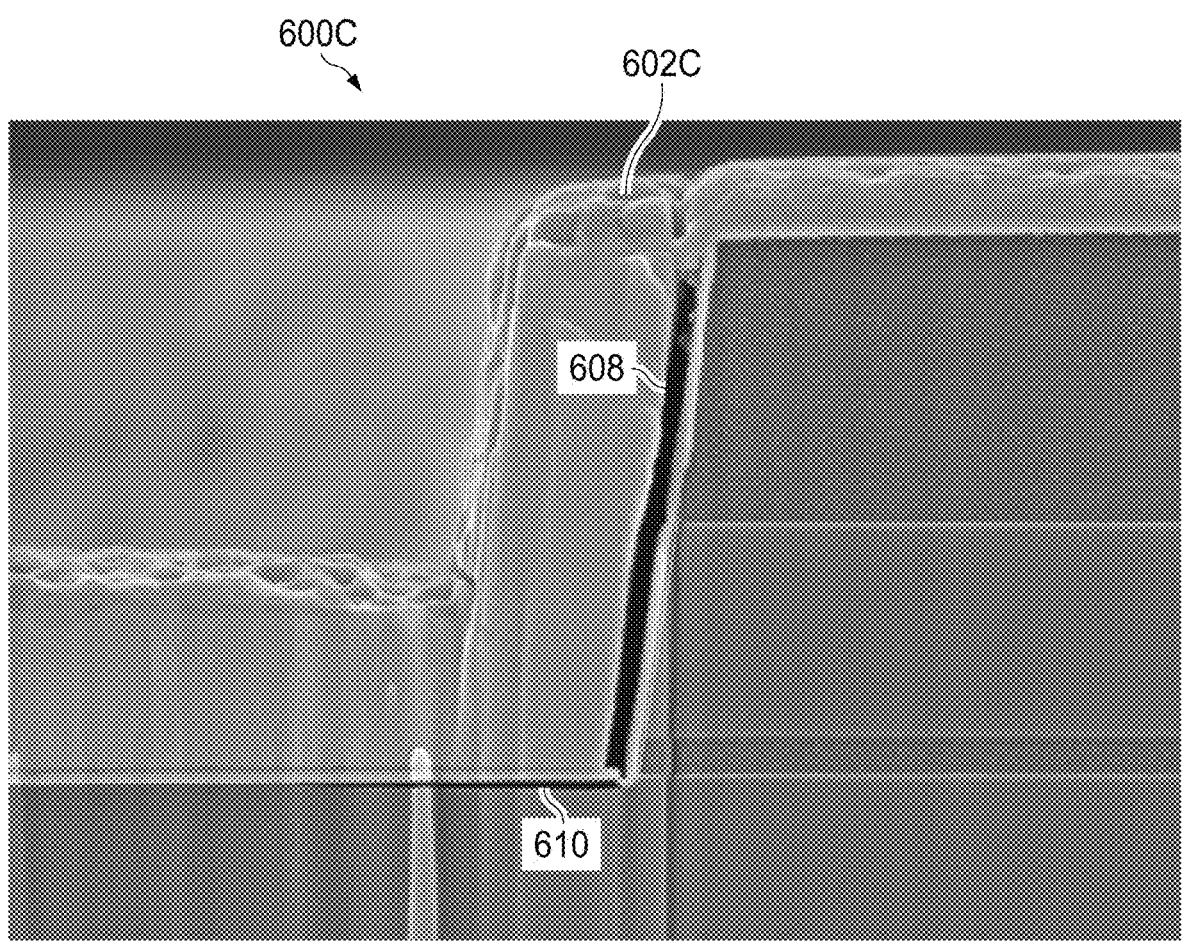

FIGS. 6A-6C depict SEM photomicrographs of baseline contact pad structures exhibiting one or more types of defects that may be advantageously reduced or prevented in one or more example implementations of the disclosure. A first top plan view of a baseline contact pad 600A having a vertical sidewall 602A shown in FIG. 6A illustrates an oxide layer crack 604. A second top plan view of a baseline contact pad 600B having a vertical sidewall 602B shown in FIG. 6B illustrates a metal layer crack 606. A cross-sectional view of a baseline contact pad 600C having a vertical sidewall 602C shown in FIG. 6C illustrates a metal film separation 608 and a barrier layer crack 610.

Examples described herein recognize that such defects may result from stress in a contact pad and/or surrounding dielectric when metal layers used to form the contact pad are removed from the dielectric surface by chemical mechanical polishing (CMP). Whereas such baseline structures include metal sidewalls of the contact pad that are generally at right angles (~90°) to the bottom of the contact pad, examples are further based on the recognition that such stress may be reduced by reducing the angle between the sidewalls and the bottom. It is thought that such an angle reduction reduces the magnitude of CMP-induced stresses and/or distributes such stresses over a larger area, making it less likely that any localized stress exceeds a critical stress that results in defects exemplified in FIGS. 6A-6C.

Referring now to FIG. 1, depicted therein is an example method of fabricating a semiconductor product including a plurality of contact pads with sloped sidewall profiles according to an implementation of the disclosure. Without limitation, example method 100 of FIG. 1 will be described as a process flow that may be implemented as part of a back-end-of-line (BEOL) or post-BEOL stage of any semiconductor fabrication or foundry process involving any type of semiconductor substrate materials, process technologies, line widths, device technologies, product types, etc., wherein reliable contact pad integration is desired for interconnecting a top level metallization layer of a semiconductor process wafer with suitable contact pad metal layers, which may or may not include barrier metal layers.

In one implementation, method 100 may commence with forming a dielectric layer over a top level metallization layer of a semiconductor process wafer, e.g., near the end of a BEOL process flow, as set forth at block 102. Depending on implementation, the dielectric layer may be formed, deposited, grown, or applied over the top metallization layer in any known or heretofore unknown processes, and may comprise one or more layers/sub-layers of known or heretofore unknown dielectric materials, seal materials, and/or moisture barrier materials (e.g., oxides, nitrides, oxynitrides, polyimides, etc.). For example, the dielectric layer may be formed as a multi-layer structure including at least one of a silicon nitride (SiN) layer, a silicon oxide (SiO) layer and/or a silicon oxynitride (SiON) layer, each layer having a corresponding chemical composition and a corresponding thickness that each may vary depending on the particular process flow implementation. Further, the top metallization layer of the semiconductor process wafer may be provided as part of a multilayer interconnect structure fabricated in a BEOL process flow involving any known or heretofore unknown processes (e.g., including but not limited to single- or dual-damascene processes) that may utilize various metal compositions for the interconnects, inter-metal vias, trenches, barrier metal layers, and the like, wherein the metallization layers (e.g., including up to 10 or more metal layers) and interlevel dielectric (ILD) insulator layers interspersed therebetween may have respective corresponding chemical compositions and thicknesses that each may also vary depending on implementation.

At block 104, the dielectric layer overlying the top level metallization layer may be patterned using a grayscale mask process to define one or more contact pad openings in the dielectric layer, thereby producing a patterned dielectric layer. In one arrangement, the contact pad opening(s) may be respectively aligned to corresponding contact pads defined in the top level metallization layer. For purposes of the present disclosure, terms such as "contact pads", "bond pads", "test pads", "probe pads", or "pads" in general, and the like, as well as other formal or informal terms of similar import are used somewhat synonymously in some arrangements, without limitation and/or loss of generality, for describing metal features defined in a top level metallization layer that may be integrated in a contact integration process for providing electrical connectivity to an external system or circuit, e.g., for bonding, test probing, etc. By way of example, such pads may have a lateral extent over the substrate of at least 50 µm in all directions. As will be set forth further below in detail, the grayscale mask process for patterning the overlying dielectric layer may be implemented in an example process flow with a fair degree of flexibility to facilitate the fabrication of contact pads having a broad range of sloped sidewall profiles depending on the process requirements, which would not otherwise be possible in conventional photolithography processes for forming pad openings.

At block 106, one or more metal layers may be formed, deposited, or otherwise applied over the patterned dielectric layer including within the one or more contact pad openings. At block 108, a portion of the metal layer may be removed by a chemical mechanical polishing (CMP) process. Depending on implementation, the metal layer(s) applied on the patterned dielectric layer may comprise different metals, metallic compositions, thicknesses, etc., which may be formed using any known or heretofore unknown techniques, e.g., a vapor deposition process, a galvanic plating process, an electroless plating process, etc.

Figure 2:
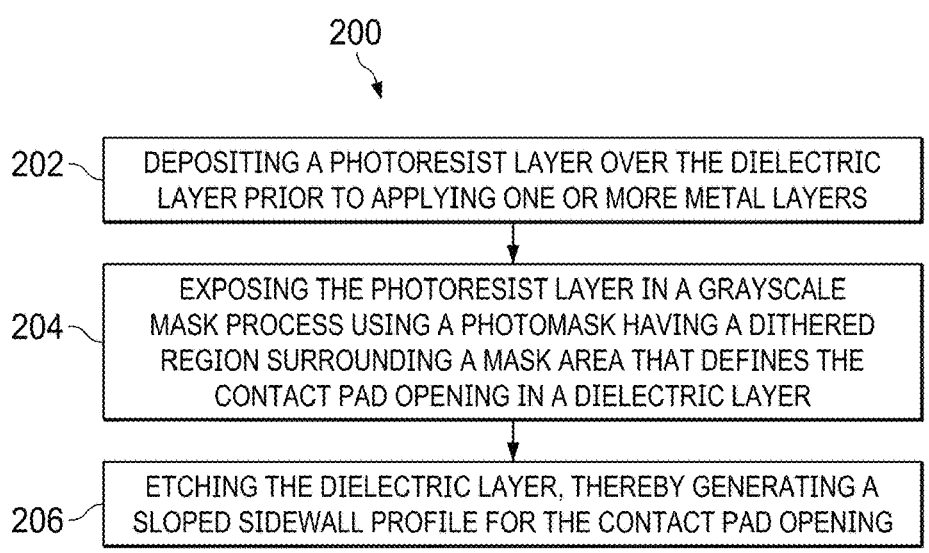
FIG. 2 depicts a flowchart of steps, blocks or acts that may be included in an example fabrication method according to an implementation of the disclosure.

FIG. 2 depicts a process flow of steps, blocks or acts that may be combined with or included in an example contact pad integration method according to an implementation of the disclosure. In one arrangement, process flow 200 of FIG. 2 may be implemented as a sub-process for patterning the overlying dielectric layer using a grayscale mask technique as set forth at block 104 of example method 100 of FIG. 1. The process flow 200 describes without implied limitation an example in which a positive photoresist is used. Differences in an analogous process using a negative resist are noted below.

At block 202, a photoresist (PR) layer of appropriate thickness may be deposited over an unpatterned dielectric layer, e.g., prior to depositing any metal layers as set forth at block 106 of FIG. 1. At block 204, the PR layer may be exposed in a grayscale mask process using a photomask having a dithered region surrounding a mask area that defines a contact pad opening aligned to a contact pad in the top level metallization layer. In one example positive resist implementation, a plurality of mask areas may comprise fully transparent areas that each may be aligned to a corresponding one of the contact pads defined in the top level metallization layer. When a negative resist is used, a dithered region surrounds each of fully opaque areas aligned to the corresponding contact pads. Depending on implementation, example photolithography process recipes may involve a variety of light/radiation sources (e.g., 436 nm ("g-line"), 405 nm ("h-line"), 365 nm ("i-line"), 248 nm (deep UV or DUV), X-rays, etc.) and associated settings, e.g., numerical aperture (NA), partial coherence (sigma parameter), exposure time, and the like. In one arrangement, the dithered regions surrounding each fully transparent area (e.g., a clear area having no chrome, thereby allowing the radiation to pass through completely) may be formed to transition to a fully opaque area of the photomask (e.g., having a pattern with full chrome that completely blocks the radiation), wherein the dithered regions may be selectively (pre)configured to allow partial blocking (or, partial transmission, conversely) of the radiation in a gradient from the fully opaque region to the fully transparent areas (or vice versa) in the photomask. When used in conjunction with a develop and etch process subsequently, an etch gradient may be developed, e.g., due to a gradual increase of PR thickness in the direction from the fully transparent areas toward the fully opaque area caused by the gradient of radiation energy, whereby a sloped edge or profile may be created in the dielectric layer for each contact pad opening (block 206).

In one arrangement, the fully transparent areas corresponding to the contact pads of the top metallization layer may each comprise a substantially square shape, whereby the etching process (e.g., a plasma etch) may cause a corresponding contact pad opening to have a four-sided sidewall profile with first and second vertical deviations along a first horizontal direction or axis parallel to the substrate surface for the first and second sidewalls, and third and fourth vertical deviations along a second horizontal direction or axis parallel to the substrate surface and perpendicular to the first horizontal direction for the third and fourth sidewalls. Vertical angular deviations (θ) in the sidewalls, e.g., deviations relative to a vertical axis perpendicular to the horizontal plane of the semiconductor process wafer (or the complementary horizontal angular deviations or slopes (90°-θ) relative to the horizontal axes, e.g., as exterior supplementary/complementary angles, along the horizontal plane of the semiconductor process wafer) may be selectively configured depending on a number of factors, e.g., including but not limited to respective annular sizing of the dithered regions around the fully transparent areas, etch processing parameters, thicknesses of the PR and dielectric layers, differential etch ratios between the PR and dielectric layers, etc. as well as how a plurality of sub-resolution features (also referred to as "gratings") patterned on the mask to cause dithering are distributed in the dithered regions. In this context, a "sub-resolution" feature is small enough that the feature is not fully resolved in the PR layer, but blocks a portion of the light received by the PR layer.

Whereas baseline patterning process flows may typically create vertical deviations of no more than 10° in the contact pad recess features of a dielectric layer (e.g., greater than 80° in an exterior angle relative to the horizontal plane of the semiconductor process wafer), grayscale mask processing (also referred to as dithered region mask processing) set forth herein may be configured to create contact pad sidewalls with vertical deviations more than 20°, e.g., in the range of 20°-55°±2.5° (which translates to angles of about 35°-70° with respect to the plane of the substrate surface). Further details may be found in U.S. Pat. No. 10,811,492, incorporated herein by reference in its entirety. As will be seen further below, such sloped sidewalls may be advantageously designed so as to help reduce the shear stresses as well as vertical/downward forces that may be exerted during a subsequent CMP process flow used in an example contact pad metallization process.

Figure 3:
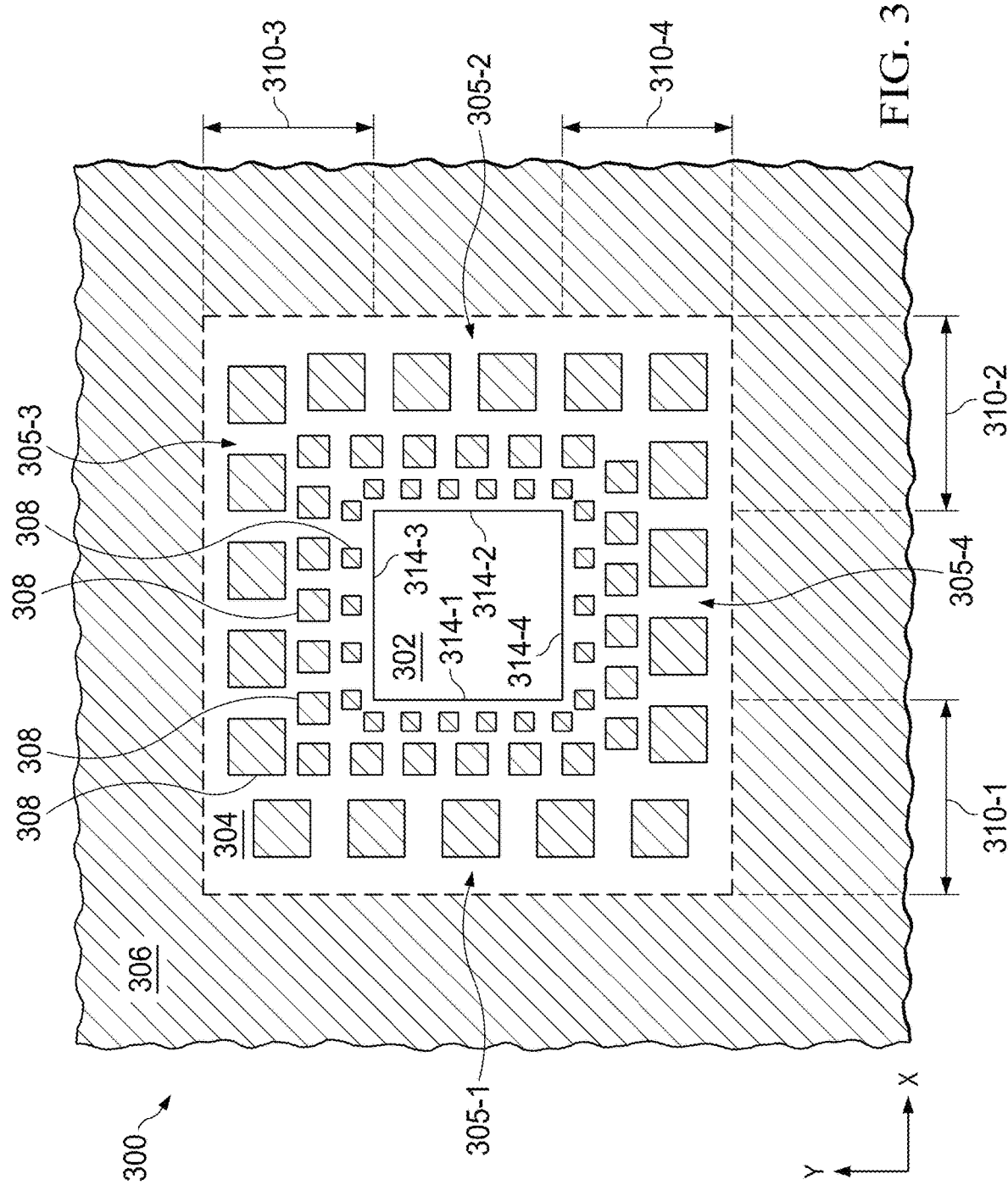
FIG. 3 depicts an example grayscale mask for patterning a dielectric layer deposited over a top level metallization layer of a semiconductor process wafer to generate contact pad openings with sloped sidewalls.

FIG. 3 depicts an example grayscale mask 300 for patterning a dielectric layer deposited over a top level metallization layer of a semiconductor process wafer to generate pad openings with sloped sidewalls. Mask 300, shown herein in a top plan view, may include a pattern of mask areas 302, e.g., a plurality of fully transparent areas each having no chrome), surrounded by a mask field area 306 (e.g., having full chrome for a positive photoresist), wherein each fully transparent area 302 gradually transitions to the surrounding field area 306 in a transition zone 304, referred to as a dithered region hereinabove, whose sizing may be the same or different in each horizontal direction along the mask plane (e.g., defined as a 2-dimensional X-Y Cartesian plane). Each dithered/transition zone 304 may include a plurality of sub-resolution features 308, each feature formed as a piece of opaque area (e.g., with chrome) having a predetermined size/shape. The sub-resolution features 308 may be arranged as one or more arrays of similarly-sized or spaced features 308, and the features may gradually vary in size, shape, density/number, etc., from the fully transparent area 302 to the field area 306 of mask 300. While shown without implied limitation as being square, the sub-resolution features 308 may also include lines (e.g., rectangles with aspect ratio >10) or any other suitable geometry. In one example implementation, fully transparent areas 302 of mask 300 may comprise a substantially square shape, wherein first and second sides 314-1, 314-2 are operative to define two sidewalls along a first axis or direction, e.g., X-axis, and third and fourth sides 314-3, 314-4 are operative to define two sidewalls along a second axis or direction, e.g., Y-axis, when used in a photolithography process to create a plurality of contact pad recess features in a dielectric layer. Vertical angular deviations of the sidewalls (see FIG. 4C) may be dependent on the sizing (e.g., the width) of corresponding dithered segments associated with the respective sides of a fully transparent area 302, in addition to the distribution of the sub-resolution features in that segment as well as the sub-resolution features' sizes, shapes, etch chemistry, and the like, as previously noted. By way of illustration, sides 314-1, 314-2 are exemplified with corresponding dithered segments 305-1, 305-2 having widths 310-1, 310-2, respectively, whereas sides 314-3, 314-4 are exemplified with corresponding dithered segments 305-3, 305-4 having widths 310-3, 310-4, respectively, where there may be some overlap between two abutting dithered segments due to the quadrilateral geometry.

Figure 5:
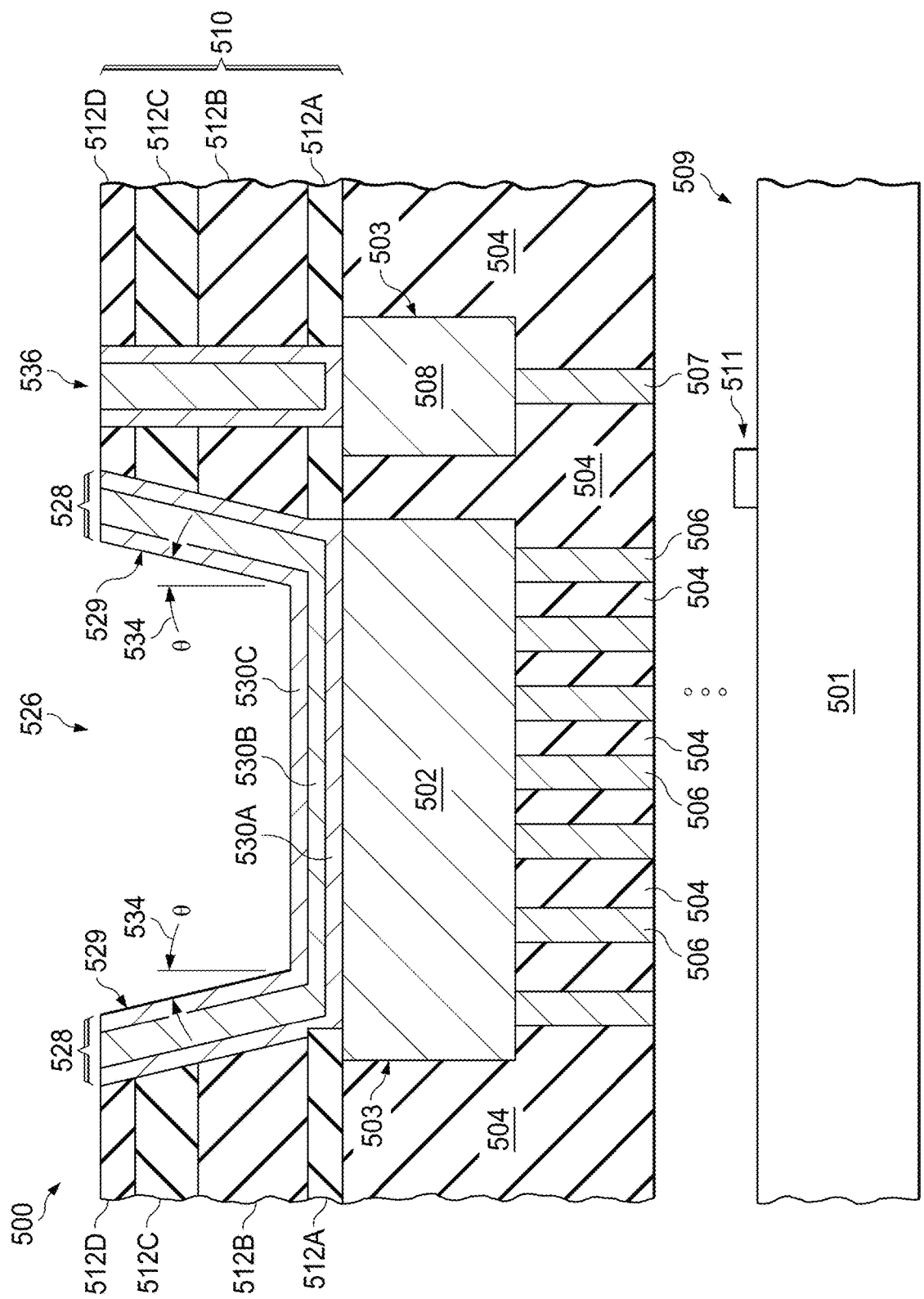
FIG. 5 depicts a cross-sectional view of a portion of a semiconductor product (e.g., formed as part of a semiconductor die or wafer) illustrating a multi-metal layer contact pad structure according to an example process flow of the disclosure.

In some examples the sub-resolution features 308 are arranged such that the vertical angular deviation is in a range from 20° to 35°. Such a range of vertical angular deviation results in a smaller total footprint, or occupied die area, of the contact pad structure 526 (FIG. 5.). However, the distance over which the transition zone 304 is implemented may make the dithered region more difficult to implement, and control of the etch process may be more difficult. In some other examples the sub-resolution features 308 are arranged such that the vertical angular deviation is in a range from 45° to 55°. This range may be advantageous in some examples to reduce the shear stress on sidewalls of the contact pad structure 526, allowing for a more complex metal layer stack. Moreover the etch process control may be easier, though the size of the contact pad structure 526 may be larger as a result of the larger area of the sidewalls projected into the plane of the substrate. In yet some other examples, sub-resolution features 308 are arranged such that the vertical angular deviation is in a range from 35° to 45°. This range may provide a balance of the undesirable and desirable attributes previously described. A suitable vertical angular deviation may be determined empirically for a particular metal stack and CMP process.

Although fully transparent areas 302 each having a regular quadrilateral shape (e.g., a square) are exemplified in FIG. 3, a dithered mask may include fully transparent areas having other 2D shapes in some implementations, e.g., rectangles, circles, elliptical shapes, polygonal shapes, etc., wherein suitable dithered regions may be provided surrounding such transparent areas. Likewise, the sub-resolution features or gratings of the dithered regions may have different distributions, shapes and sizes, which in turn may be dependent on applicable photolithography recipes, e.g., the wavelengths and NA settings used in photolithography, PR compositions and thicknesses, and the like.

Figure 4A:
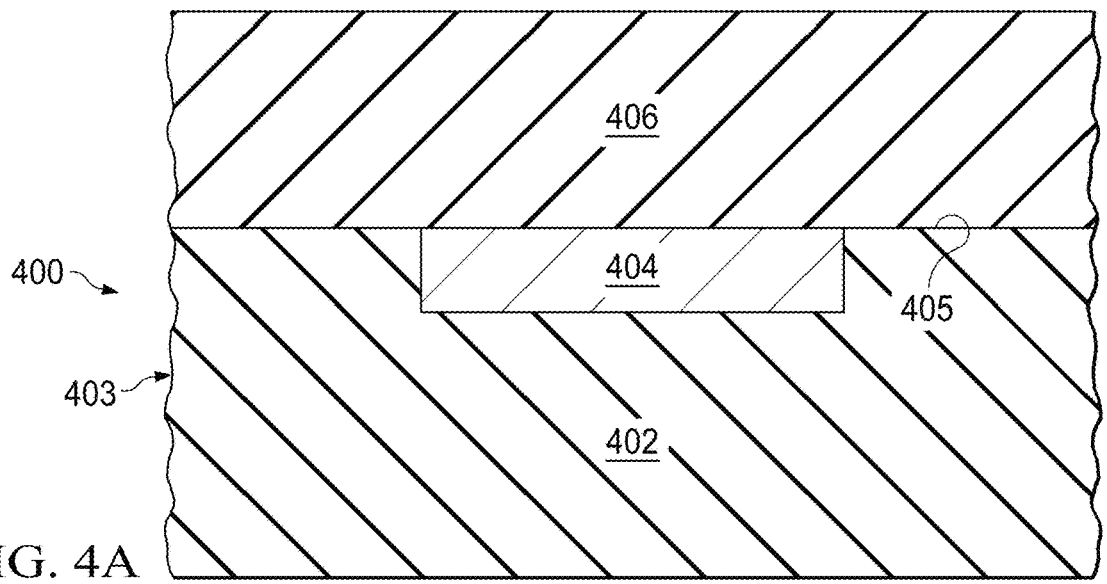
FIGS. 4A-4D illustrate cross-sectional schematic views of a semiconductor process wafer in an example process flow for creating a plurality of contact pads with sloped sidewall profiles according to an implementation of the disclosure.
Figure 4B:
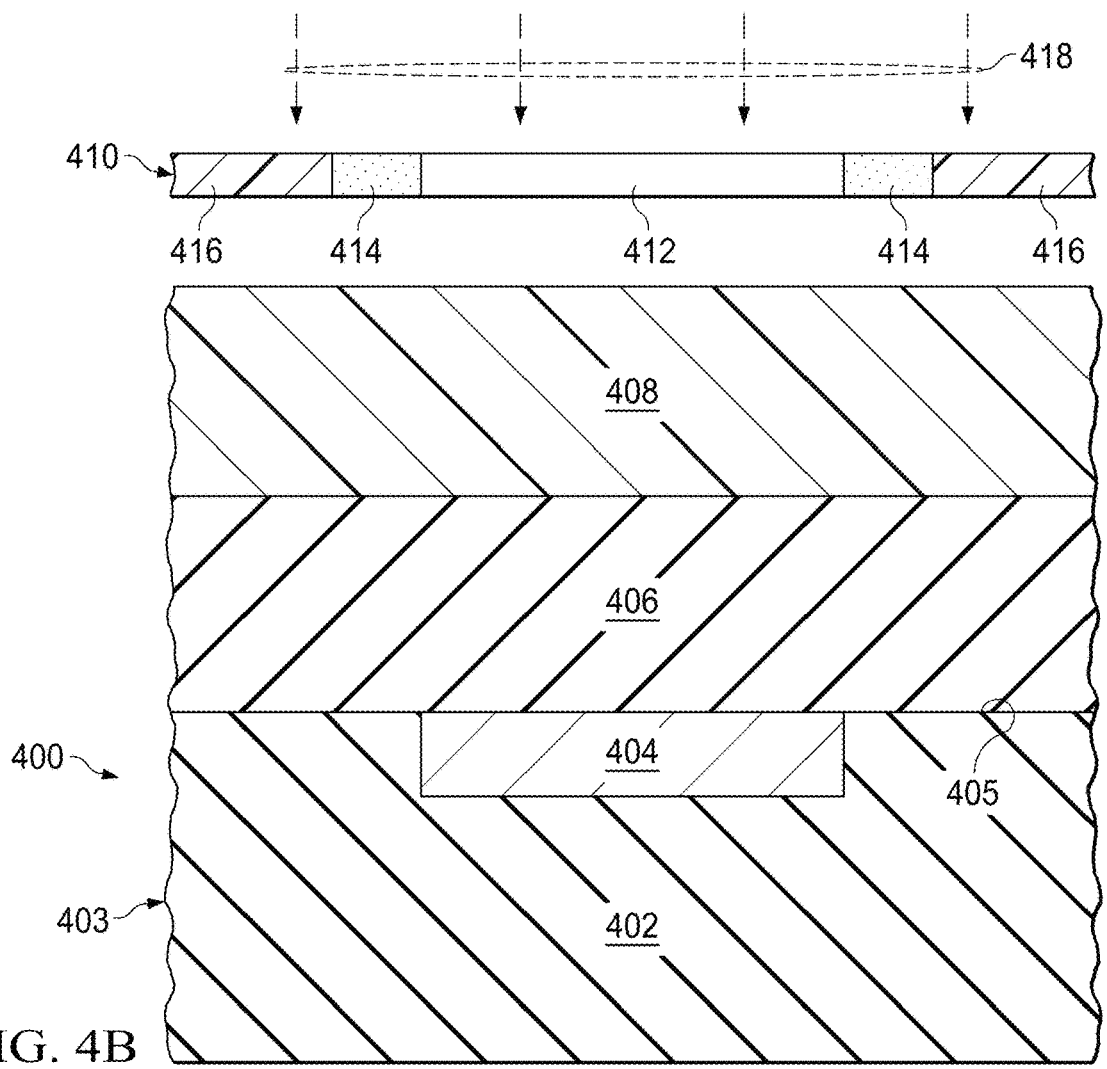
Figure 4C:
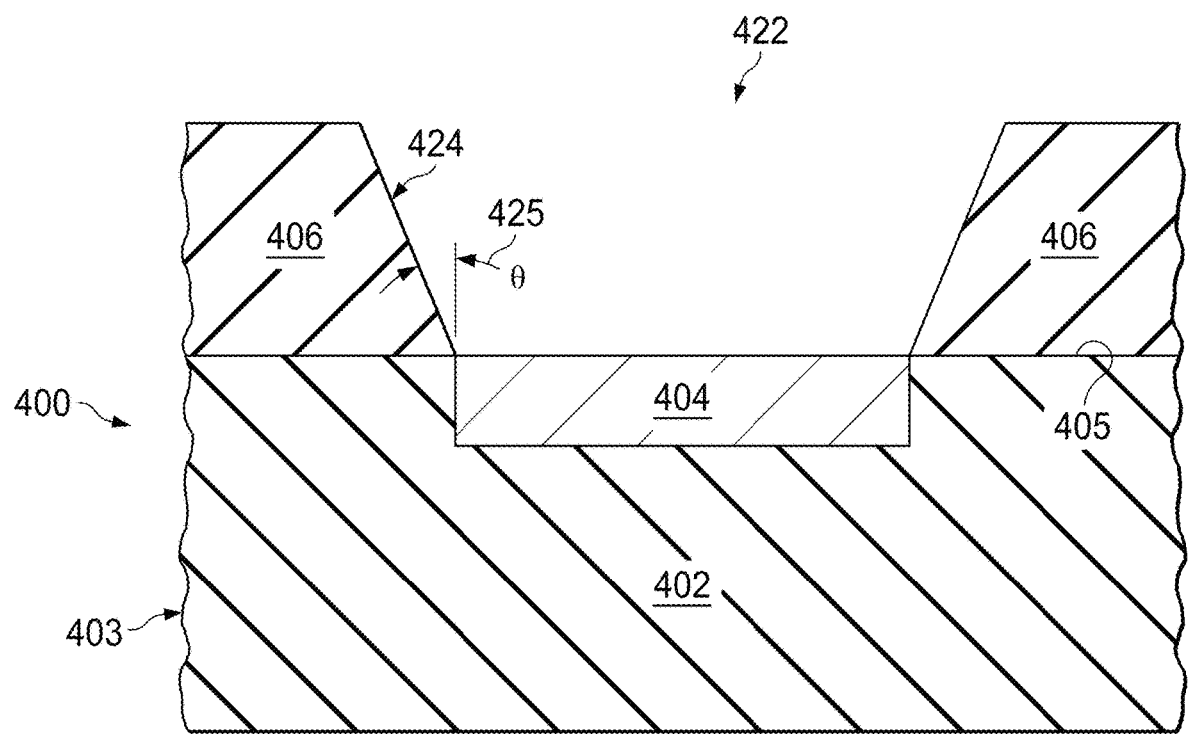
Figure 4D:
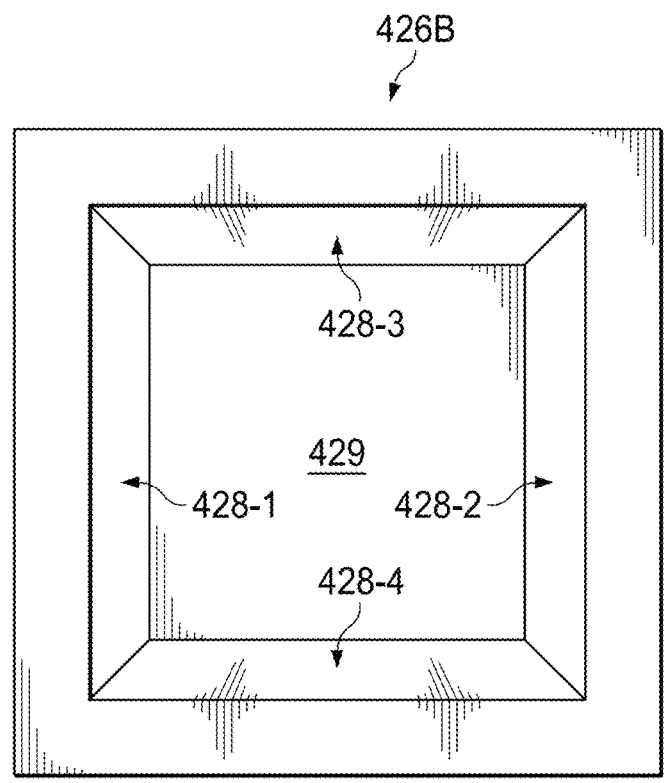
Figure 4D:
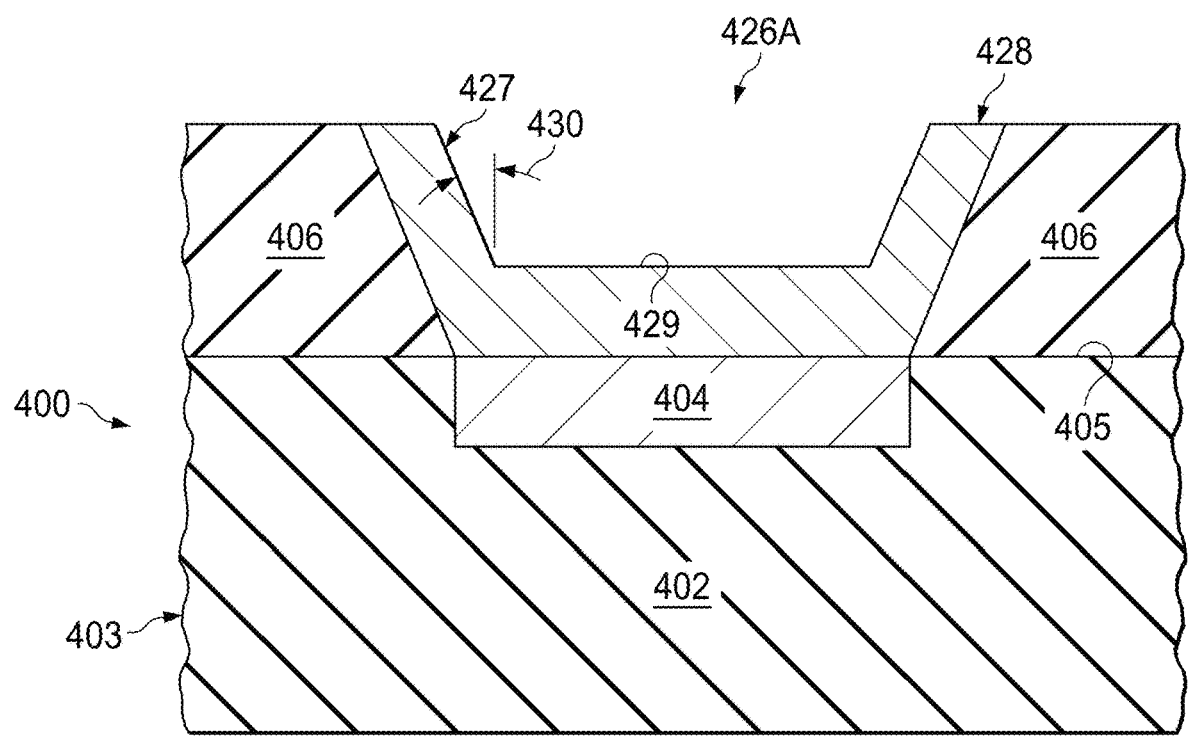

FIGS. 4A-4D illustrate cross-sectional schematic views of a semiconductor process wafer in an example process flow for creating a plurality of contact pads with sloped sidewall profiles according to an implementation of the disclosure. FIG. 4A depicts a representative semiconductor process wafer 400, or a portion thereof, wherein a dielectric layer 406 is deposited over a top surface 405 of a substrate 403 containing a top level metallization layer with a contact pad 404 formed in an ILD layer 402 of substrate 403 according to a BEOL process. FIG. 4B depicts patterning of the dielectric layer 406 in a photolithography process involving suitable light/radiation 418 in conjunction with a photoresist 408 and a grayscale mask 410 having a fully transparent area 412 aligned to the contact pad 404, wherein the fully transparent area 412 is surrounded by a dithered region 414 that gradually transitions to a fully opaque area 416 of the mask 410. FIG. 4C depicts the formation of a contact pad opening 422 in the dielectric layer 406 aligned to the contact pad 404, wherein a sloped sidewall profile 424 having a vertical angular deviation 425 may be created after a suitable develop and etching process (e.g., a plasma etch) as set forth above. In this context a "sloped sidewall profile" means the sidewall vertical angular deviation 425 is at least 20°. One or more metal layers, e.g., including any diffusion barrier metal layers, may be formed over the patterned dielectric layer 406 containing the contact pad recess feature(s) to obtain corresponding contact pad structure(s) 426A as depicted in FIG. 4D. Such metal layers may be formed using any number of techniques, e.g., vapor deposition processes, galvanic plating processes, electroless plating processes, etc. in a sequential manner, wherein one or more metal layers may be polished in a CMP process. By way of illustration, metal layer 428 is representative of a single- or multi-layer metal structure of the contact pad structure 426A having a sloped profile 427 with a vertical deviation 430 that may be substantially identical to the sidewall vertical angular deviation 425 of the contact pad opening 422 formed in the dielectric layer 406. In this context, two vertical deviations are substantially identical when they differ by ±1° or less. Conversely, two vertical deviations are substantially different when they differ by ±2.5° or more. FIG. 4D further illustrates a top plan view 426B of the contact pad structure 426A, wherein four sidewalls 428-1 to 428-4 extending upward from a bottom surface 429 of the contact pad structure 426A are exemplified.

FIG. 5 depicts a cross-sectional view of a portion of a semiconductor product illustrating a multi-metal layer contact pad structure according to an implementation of the disclosure. In one arrangement, portion 500 may exemplify a semiconductor substrate 501 (such as a process wafer), or a semiconductor die formed therein or thereover formed in a sequence of front-end-of-line (FEOL) flow followed by a BEOL flow that includes providing a top level metallization layer 503 having a plurality of metal features in an ILD layer 504. In one arrangement, the metal features defined in top level metallization layer 503 may comprise features 508 for integrating narrow via post structures 536 as well as pads 502 for integrating wider contact pad structures 526 in an overlying dielectric layer 510 that may be patterned using a grayscale mask process as described above. As exemplified, pads 502 may comprise damascene copper contact or bond pads (e.g., each approximately 50 µm to 300 µm per side) that may be electrically connected to other metallic interconnections or levels 509 and electrical components 511, such as transistors, by way of a plurality of inter-level metallic vias 506. In one arrangement, features 508 (which may be representative of a scribe seal structure in some implementations) may be dielectrically isolated from pads 502 but electrically coupled to other metallic interconnections by way of corresponding inter-level metallic vias 507.

Depending on implementation, dielectric layer 510 may have a total thickness of several hundreds or thousands of Angstroms (e.g., 2,000 Å to 3.2 µm) that includes one or more layers of insulator materials selected from silicon nitride, silicon oxide, oxynitride, polyimide, and the like that may be overlain and patterned as described previously. For example, dielectric layer 510 may include a silicon nitride (SiN) layer 512A of about 2,000 Å, a first silicon oxide (SiO) layer 512B of about 1 µm, a silicon oxynitride (SiON) layer 512C of about 1.4 µm, and a second SiO layer 512D of about 2,000 Å. The layers 512A, 512B, 512C and 512D may serve as a protective, or passivation, overcoat (PO) layer for the semiconductor device. Wider contact pad recess features or openings having sloped sidewall profiles as well as narrower via recess features without sloped sidewall profiles may be formed in the dielectric layer 510 using a single grayscale photomask, wherein the fully transparent areas corresponding to the bond/contact pads 502 may be provided with appropriate dithered regions whereas the fully transparent areas corresponding to other metal features 508 are devoid of any dithering. A photoresist having a thickness of about 2.5 µm and I-line exposure conditions of NA of about 0.63 and a sigma of about 0.57 (partial coherence parameter defined as a ratio of condenser lens NA and projection lens NA) may be used for patterning the dielectric layer 510 in an example implementation of the present disclosure, wherein suitable sidewall vertical angular deviations 534 may be achieved after a plasma etch and clean process. A composite pad metal layer 528 may be formed as follows. A first barrier metal layer 530A having following example compositions and thicknesses may be deposited: approximately 180 Å of tantalum (Ta), approximately 300 Å tantalum nitride (TaN), approximately 200 Å titanium (Ti) and approximately 20 Å of titanium nitride (TiN). An intermediate sandwich metal layer 530B of tungsten (W) having a thickness of about 5.9 µm is deposited over the first barrier metal layer 530A, which is subsequently polished using a tungsten CMP process, whereby all or most of the metal layers 530A and 530B are removed over the SiO layer 512D. A second barrier metal layer 530C having following example compositions and thicknesses may be deposited: approximately 170 Å of Ta/TaN, approximately 2,000 Å of nickel (Ni) and approximately 750 Å of palladium (Pd), which is followed by a second CMP process whereby the metal layer 530C and any remaining portion of the metal layer 530A are removed over the SiO layer 512D. Remaining portions of the metal layers 530A, 530B and 530C serve as the composite pad metal layer 528 having a sloped sidewall 529. In some arrangements, not all metal depositions may be applied with respect to narrow recess structures in the dielectric layer 510, e.g., via structures 536, due to the size constraints.

Because of the sloping of sidewall profiles provided in the wider contact pad recess features, vertical/horizontal shear stresses caused by CMP processes, e.g., tungsten CMP, may be minimized, thus reducing the risk of delamination/separation of the contact pad metal layers from the sidewall. Further, sloped sidewalls can help minimize vertical forces on the barrier metal layers at the base of the sidewalls, thereby reducing the risk of causing cracks—and the propagation thereof—in the metal layers and/or oxide layers. Accordingly, the integrity of contact pad metal films and associated dielectrics may be maintained, thus improving the reliability of the overall structure in example implementations of the present disclosure (e.g., by preventing moisture seepage, penetration of corrosive chemicals used in pad surface conditioning, etc.).

In some examples an etch process may be used to form the sloped sidewall profile 424 (FIG. 4C) without the need for the grayscale lithographic process. For example, an oxygen-rich plasma may be used to etch the dielectric layer 406 using a photoresist layer with vertical, nearly vertical or slightly sloped sidewalls. The oxygen-rich plasma process may cause the photoresist sidewalls to retreat toward the photoresist layer during the etch process. The dynamic sidewall position may in turn result in a longer time that portions of the dielectric layer 406 nearer to the contact pad 404 are exposed to the plasma, and a shorter time that portions of the dielectric layer 406 further from the contact pad 404 are exposed to the plasma. The time difference results in a sloped sidewall that may have a vertical angular deviation in a range from 20° to 55°.

Example (experimental) implementations of embodiments consistent with the disclosure may result in a significant reduction of defects such as those exemplified in FIGS. 6A-6C. Such defect reduction is expected to significantly reduce yield loss and field failures of semiconductor devices that implement such improvements.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims.

It should further be understood that the order or sequence of the acts, steps, functions, components or blocks illustrated in any of the flowcharts depicted in the drawing Figures of the present disclosure may be modified, altered, replaced, customized or otherwise rearranged within a particular flowchart, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of the present patent disclosure. Accordingly, those skilled in the art will recognize that the example implementations described herein can be practiced with various modifications and alterations within the spirit and scope of the claims appended below.

What is claimed is:

1. A method, comprising:
   forming a dielectric layer over a top level metallization layer of a semiconductor process wafer;
   patterning the dielectric layer using a grayscale mask process to define a contact pad opening in the dielectric layer, thereby producing a patterned dielectric layer, wherein the contact pad opening is aligned to a contact pad defined in the top level metallization layer;
   depositing a metal layer over the patterned dielectric layer including within the contact pad opening; and
   removing a portion of the metal layer by a chemical mechanical polishing (CMP) process, a remaining portion of the metal layer having a sloped sidewall.

2. The method as recited in claim 1, wherein the patterning of the dielectric layer comprises:
   prior to depositing the metal layer, depositing a photoresist layer over the dielectric layer;
   exposing the photoresist layer in the grayscale mask process using a photomask having a dithered region surrounding a mask area that defines the contact pad opening; and
   etching the dielectric layer thereby generating a sloped sidewall profile for the contact pad opening.

3. The method as recited in claim 2, wherein the photoresist is a positive photoresist and the surrounded mask area is fully opaque.

4. The method as recited in claim 1, wherein a fully transparent area of a photomask corresponding to the contact pad and used in the grayscale mask process, comprises a substantially square shape, wherein the contact pad opening has a sloped sidewall profile with first and second sidewall vertical angular deviations along a first horizontal axis, and third and fourth sidewall vertical angular deviations along a second horizontal axis perpendicular to the first horizontal axis, the first sidewall vertical angular deviation being different than at least one of the second, third and fourth sidewall vertical angular deviations.

5. The method as recited in claim 2, wherein the dithered region comprises an array of sub-resolution features that vary in at least one of size and density between the mask area defining the contact pad opening and a mask field area surrounding the dithered region.

6. The method as recited in claim 1, wherein the sloped sidewall has a vertical angular deviation of about 20° to about 55°.

7. The method as recited in claim 1, wherein the sloped sidewall includes four sloped sidewall segments having substantially identical sidewall vertical angular deviations.

8. The method as recited in claim 1, wherein the sloped sidewall includes four sloped sidewall segments at least one having a substantially different sidewall vertical angular deviation than others of the sloped sidewall segments.

9. The method as recited in claim 1, wherein the dielectric layer comprises a multi-layer protective overcoat (PO) structure including at least one of a silicon nitride (SiN) layer, a silicon oxide (SiO) layer and a silicon oxynitride (SiON) layer.

10. The method as recited in claim 1, wherein the metal layer comprise a first barrier metal layer of at least one of tantalum (Ta) and tantalum nitride (TaN), and a second barrier metal layer of at least one of nickel (Ni) and palladium (Pd), the first and second barrier metal layers sandwiching a tungsten (W) layer.

11. The method as recited in claim 1, wherein the top level metallization layer comprises a damascene copper layer.

12. A semiconductor product, comprising:
    a semiconductor substrate including a top level metallization layer; and
    a plurality of contact pad structures formed in a dielectric layer deposited over the top level metallization layer, the plurality of contact pad structures each having a sloped sidewall profile,
    wherein each contact pad structure comprises a bottom surface of a substantially square shape, the sloped sidewall profile extending from the bottom surface with first and second sidewall vertical angular deviations along a first horizontal axis, and third and fourth sidewall vertical angular deviations along a second horizontal axis perpendicular to the first horizontal axis.

13. The semiconductor product as recited in claim 12, wherein the plurality of contact pad structures are formed by patterning the dielectric layer in a grayscale mask process using a photoresist exposed with a photomask having a dithered region surrounding a mask area that defines a contact pad opening in the dielectric layer corresponding to a respective one of a plurality of contact pads defined in the top level metallization layer, the dithered region varying in density from the surrounded mask area to a mask field area surrounding the dithered region.

14. The semiconductor product as recited in claim 12, wherein each of the first, second, third and fourth sidewall vertical angular deviations comprises a vertical angular deviation in a range from about 20° to about 55°.

15. The semiconductor product as recited in claim 12, wherein the first, second, third and fourth sidewall vertical angular deviations each comprise vertical angular deviations that are substantially identical to one another.

16. The semiconductor product as recited in claim 12, wherein at least one of the first, second, third and fourth sidewall vertical angular deviations each comprises an angle substantially different from one another.

17. The semiconductor product as recited in claim 12, wherein the dielectric layer comprises a multi-layer protective overcoat (PO) structure including at least one of a silicon nitride (SiN) layer, a silicon oxide (SiO) layer and a silicon oxynitride (SiON) layer.

18. The semiconductor product as recited in claim 12, wherein each contact pad structure comprises a first barrier metal layer of at least one of tantalum (Ta) and tantalum nitride (TaN), and a second barrier metal layer of at least one of nickel (Ni) and palladium (Pd), the first and second barrier metal layers sandwiching a tungsten (W) layer.

19. The semiconductor product as recited in claim 12, wherein the top level metallization layer comprises a damascene copper layer.

20. A method, comprising:
  forming a dielectric layer over a metal contact pad located over a semiconductor substrate;
  forming a photoresist layer over the dielectric layer;
  forming an opening in the photoresist layer over the metal contact pad thereby exposing a portion of the dielectric layer; and
  etching the dielectric layer thereby removing the exposed portion of the dielectric layer and forming dielectric sidewalls surrounding the metal contact pad that have a vertical angular deviation of at least 20°.

21. The method as recited in claim 20, wherein the vertical angular deviation is in a range from 20° to 35°.

22. The method as recited in claim 20, wherein the vertical angular deviation is in a range from 35° to 45°.

23. The method as recited in claim 20, wherein the vertical angular deviation is in a range from 45° to 55°.

24. An integrated circuit, comprising:
  a semiconductor substrate including a top level metallization layer; and
  a plurality of contact pad structures formed in a dielectric layer deposited over the top level metallization layer, the plurality of contact pad structures each having a sloped sidewall profile,
  wherein each contact pad structure comprises a first barrier metal layer of at least one of tantalum (Ta) and tantalum nitride (TaN), and a second barrier metal layer of at least one of nickel (Ni) and palladium (Pd), the first and second barrier metal layers sandwiching a tungsten (W) layer.

25. An integrated circuit, comprising:
  a semiconductor substrate including a top level metallization layer; and
  a plurality of contact pad structures formed in a dielectric layer deposited over the top level metallization layer, the plurality of contact pad structures each having a sloped sidewall profile,
  wherein the plurality of contact pad structures are formed by patterning the dielectric layer in a grayscale mask process using a photoresist exposed with a photomask having a dithered region surrounding a mask area that defines a contact pad opening in the dielectric layer corresponding to a respective one of a plurality of contact pads defined in the top level metallization layer, the dithered region varying in density from the surrounded mask area to a mask field area surrounding the dithered region.

* * * * *